United States Patent
Smith

(10) Patent No.: US 8,710,622 B2
(45) Date of Patent: Apr. 29, 2014

(54) DEFECTED GROUND PLANE INDUCTOR

(75) Inventor: David M. Smith, Sebastian, FL (US)

(73) Assignee: Harris Corporation, Melbourne, FL (US)

( * ) Notice: Subject to any disclaimer, the term of this patent is extended or adjusted under 35 U.S.C. 154(b) by 36 days.

(21) Appl. No.: 13/298,359

(22) Filed: Nov. 17, 2011

(65) Prior Publication Data

US 2013/0127009 A1    May 23, 2013

(51) Int. Cl.
*H01L 27/08* (2006.01)

(52) U.S. Cl.
USPC .......................................... 257/531

(58) Field of Classification Search
USPC .......................................... 257/531
See application file for complete search history.

(56) References Cited

U.S. PATENT DOCUMENTS

| | | | |
|---|---|---|---|
| 5,446,311 A | | 8/1995 | Ewen et al. |
| 6,380,608 B1 | | 4/2002 | Bentley |
| 2002/0084509 A1 | | 7/2002 | Ballantine et al. |
| 2002/0109204 A1 | | 8/2002 | Acosta et al. |
| 2005/0040471 A1 * | | 2/2005 | Harris et al. ............ 257/379 |
| 2005/0073025 A1 * | | 4/2005 | Hashizume et al. ...... 257/531 |
| 2006/0158286 A1 | | 7/2006 | Lai et al. |
| 2009/0108369 A1 | | 4/2009 | Chu |
| 2009/0183358 A1 * | | 7/2009 | Jow et al. ............... 29/602.1 |
| 2009/0311841 A1 | | 12/2009 | Bavisi et al. |
| 2010/0295151 A1 * | | 11/2010 | Kurokawa ............... 257/531 |
| 2010/0327404 A1 | | 12/2010 | Smith et al. |

FOREIGN PATENT DOCUMENTS

JP          7-74311       * 3/1995
WO    WO 2010/050091   * 5/2010

OTHER PUBLICATIONS

Toshiba Corp, JP 7-74311 Machine Translation, Mar. 11, 2013.*
Weng, L.H., et al., "An Overview on Defected Ground Structure", Progress in Electromagnetics Research B, vol. 7, 2008, pp. 173-189; Retrieved from the Internet: URL:htto://www.jpier.org/PIERB/pierb07/11.

* cited by examiner

*Primary Examiner* — Jae Lee
(74) *Attorney, Agent, or Firm* — Fox Rothschild, LLP; Robert J. Sacco

(57) ABSTRACT

An spiral inductor (300) formed on a semiconductor substrate (102). One or more insulating layers (104, 303) is disposed on a first surface of the semiconductor substrate. A spiral structure (106) is formed of a first conductive material layer disposed on the insulating layer. The spiral structure has a terminal end (105) at a location enclosed by one or more coils of the spiral. A ground plane (302) is formed of a second conductive material and disposed on a second surface located on a side of the substrate opposed from the first surface. The ground plane is defected so as to define a signal trace (308) formed from a portion of the ground plane. A conductive via (304) extends through the one or more insulating layers, and through the semiconductor substrate, to form an electrical connection between the ground plane and the terminal end.

7 Claims, 4 Drawing Sheets

DEFECTED GROUND PLANE INDUCTOR

BACKGROUND OF THE INVENTION

1. Statement of the Technical Field

The inventive arrangements relate to inductors on semiconductor substrates and methods for forming the same, and more specifically to spiral type inductors on semiconductor substrates having a high quality factor.

2. Description of the Related Art

Spiral inductors are commonly used in monolithic integrated circuits designed for radio frequency (RF) applications. For example, spiral inductors are frequently formed on semiconductors substrates comprised of silicon or gallium arsenide.

Conventional spiral inductors in silicon-based integrated circuits typically have performance limits with respect to the quality factor (Q factor) and the self resonant frequency (the maximum frequency at which the inductor behaves ideally). This limited performance is due to a variety of factors including the series resistance $R_S$ representing the ohmic losses in the coil, and substrate losses. Substrate losses are usually associated with the oxide capacitance $C_{Ox}$, and bulk silicon substrate resistivity losses $R_B$. In general, these factors tend to degrade the Q factor and lower the self-resonant frequency of the inductor.

Some efforts to improve Q have focused on reducing ohmic losses in the coil. This has been done by fabricating the basic coil using several metal layers that are shunted together using multilevel interconnects. Some designs have also chosen to omit the lowest metal layers to reduce $C_{Ox}$. In other design, selective removal of portions of the substrate beneath the coil has been shown to further improve the value of Q. Still, these efforts have not achieved an entirely satisfactory level of Q and/or self resonance frequency. Improving the Q and/or the self resonant frequency would increase the usefulness of the inductor in many applications.

SUMMARY OF THE INVENTION

Embodiments of the invention concern an inductor formed on a semiconductor substrate, such as silicon or gallium arsenide. One or more insulating layers is disposed on a first surface of the semiconductor substrate. For example, if the substrate is silicon, the insulating layer can be silicon dioxide. A spiral structure is formed of a first conductive material layer disposed on the insulating layer. The spiral structure, which can be formed of metal, has a terminal end at a location enclosed by one or more coils of the spiral. A ground plane is formed of a second conductive material and disposed on a second surface located on a side of the substrate opposed from the first surface. The ground plane can also be a metal layer. The ground plane is defected so as to define a signal trace formed from a portion of the ground plane. The signal trace is electrically isolated from a remainder of the ground plane by a gap in the second conductive material. A conductive via extends through the one or more insulating layers, and through the semiconductor substrate, to form an electrical connection between the ground plane and the terminal end.

The invention also includes an integrated electronic circuit formed on a semiconductor substrate which includes the inductor described above. The integrated electronic circuit includes a plurality of electrical components disposed on the substrate, and at least one of the electrical components is electrically connected to the inductor by means of the signal trace.

The invention also concerns a method for forming an inductor. The method can include disposing on a first surface of a semiconductor substrate at least one insulating layer, and forming on the insulating layer a first spiral structure. The spiral structure is made from a first conductive material layer, and has a terminal end at a location enclosed by one or more coils of the first spiral structure. A ground plane is formed of a second conductive material on a second surface located on a side of the substrate opposed from the first surface. The method includes defecting the ground plane so as to define a signal trace formed from a portion of the ground plane, where the signal trace is electrically isolated from a remainder of the ground plane by a gap in the second conductive material. The method also includes forming a conductive via extending through the one or more insulating layers, and through the semiconductor substrate, to provide an electrical connection between the ground plane and the terminal end.

BRIEF DESCRIPTION OF THE DRAWINGS

Embodiments will be described with reference to the following drawing figures, in which like numerals represent like items throughout the figures, and in which.

DETAILED DESCRIPTION

Figure 1:
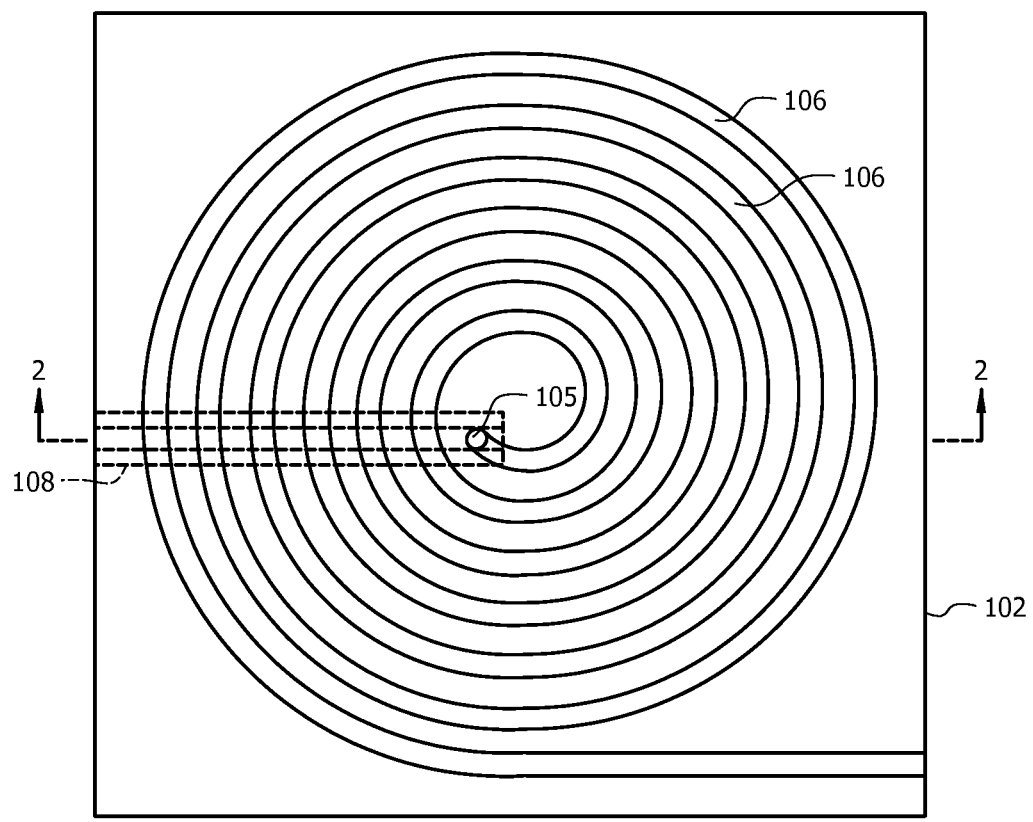
FIG. 1 is a top view of a spiral inductor on a silicon substrate.

The invention is described with reference to the attached figures wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

Figure 2:
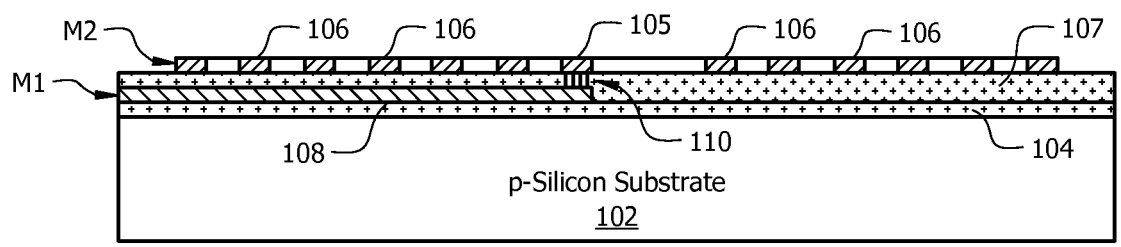
FIG. 2 is a cross-sectional view of the spiral inductor in FIG. 1, taken along line 2-2.

As illustrated in FIGS. 1 and 2, a spiral inductor 100 is fabricated on a semiconductor substrate 102, such as silicon. The spiral inductor 100 is formed using standard fabrication line steps appropriate for patterning of oxide and metal over a silicon substrate. The spiral inductor can include two or more conductive metal layers M1, M2, where the first metal layer M1 is the first metal layer above a layer of silicon dioxide 104, on a silicon substrate 102. The first metal layer M1 is covered by a second layer of silicon dioxide 107 through which one or more vias 110 are formed. As is known in the art, the silicon dioxide layer serves as an insulating layer. The vias 110 are filled with a conductive metal to interconnect the first metal layer with the second metal layer M2. The first metal layer M1 is used to form a crossover or underpass 108 to make a connection to the central or inner terminal end 105 of a spiral structure 106 formed on metal layer M2. As best understood from FIG. 1, the terminal end 105 is the end of the spiral structure that is enclosed by one or more coils of the spiral structure 106.

In order to achieve a higher Q, two or more vertically aligned identical spiral structures 106 can be provided, and a plurality of conductive metal vias used to electrically connect the two spiral structures along their spiral length. The vias effectively shunt the two metal layers. Consequently, two conductive metal layers are used for the turns of the spiral inductor, and these two layers provide two inductors connected in parallel to reduce ohmic losses. Such an arrangement is taught in U.S. Pat. No. 5,446,311. The ohmic losses can be reduced further by shunting more metal layers if extra wiring levels are available in the line process.

Other means for improving Q have included the use of etching or micro-machining to remove a portion of the silicon dioxide layers above or below the spiral structure 106 to create an air-bridge for the crossover over the spiral inductor structure. However, air bridge structures add steps to the fabrication process, and introduce reliability concerns. In the case of an air-bridge crossover, the span required can be large, especially when the inductor has a large number of turns. As a result, such spans can be fragile, reducing the reliability of such spiral inductors in ICs. Further, for certain dimensions and materials, fabrication of an air-bridge crossover is generally non-trivial, resulting in increased manufacturing complexity and consequently driving up manufacturing costs.

In the case of a dielectric spaced over/underpass as shown in FIGS. 1 and 2, additional metallization layers can be required for the IC, at least marginally increasing costs and complexity. Further, while such structures may be less fragile and more reliable than air-bridge crossovers, such over/underpass structures are also not without issues. For example, it has been found that the introduction of additional dielectric materials between the inductor windings and the over/underpass can introduce additional capacitive coupling, resulting in degradation of the Q factor and self-resonant frequency.

Figure 3:
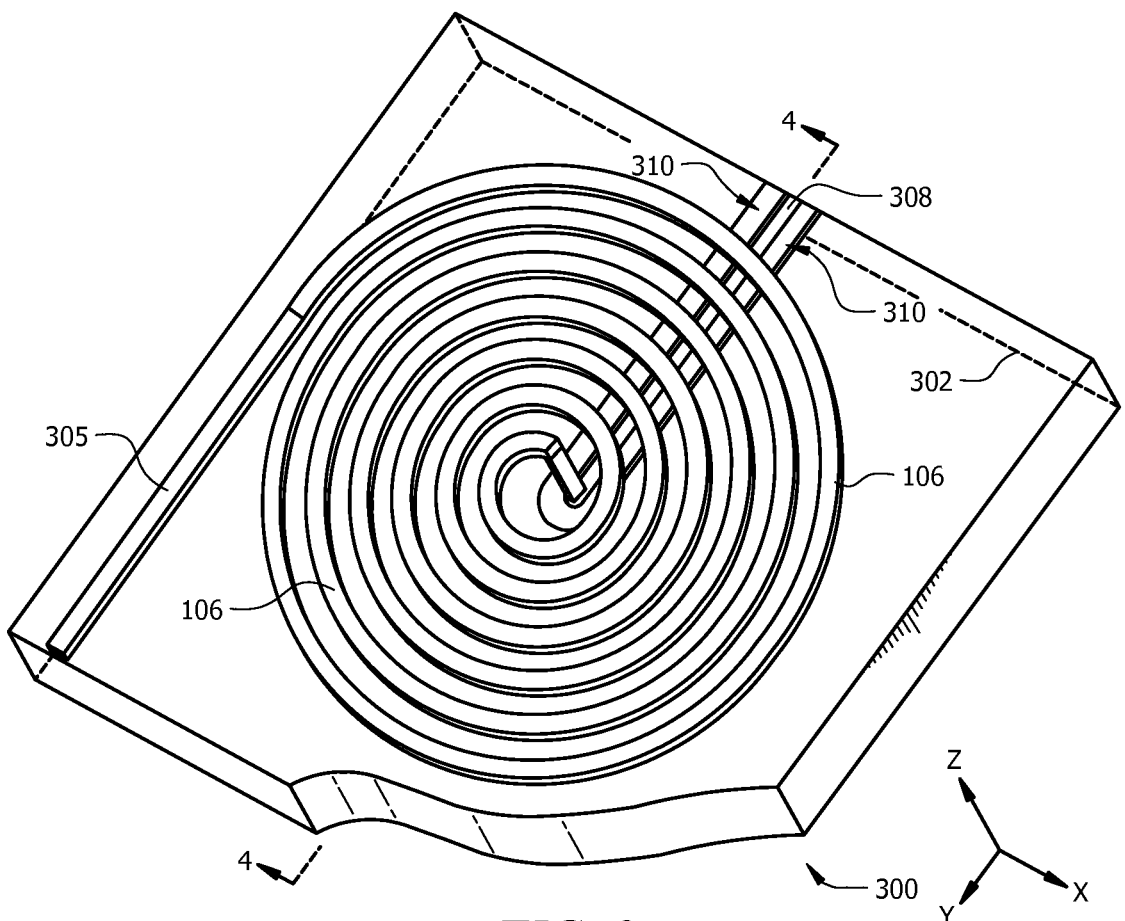
FIG. 3 is a perspective view of a spiral inductor that is useful for understanding the invention.
Figure 4:
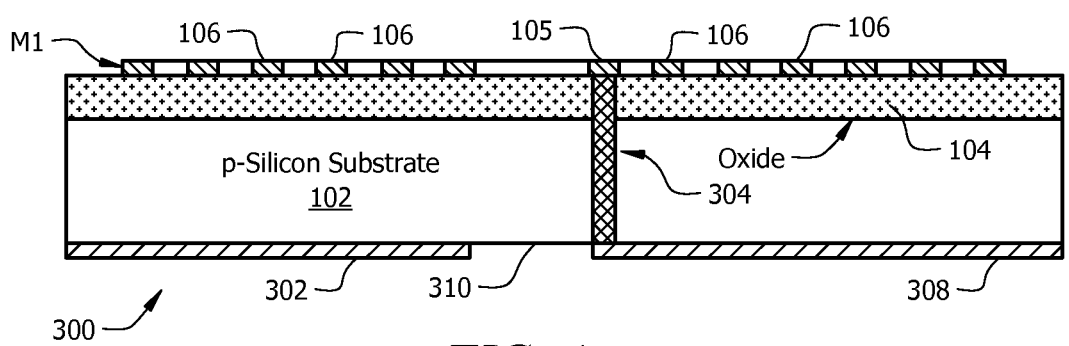
FIG. 4 is a cross-sectional view of the spiral inductor of FIG. 3, taken along line 4-4.

Referring now to FIGS. 3 and 4, there is provided a spiral inductor 300 which is similar to the arrangement described above-with respect to FIGS. 1 and 2, but offers higher values of Q and higher self resonance frequency. The spiral inductor 300 is fabricated on a semiconductor substrate 102, and includes one or more insulating layers, at least one metal layer and a ground plane layer 302. The invention is not limited to a particular semiconductor substrate, but in one embodiment the substrate can be silicon. In another embodiment, the semiconductor can be formed of gallium arsenide. If the substrate is silicon, the spiral inductor 300 is formed using standard fabrication line steps appropriate for patterning of oxide and metal over a silicon substrate. As such, the spiral inductor 300 can include at least one conductive metal layer M1 above at least one insulating layer 104. The insulating layer can be formed of silicon dioxide or any other insulating layer now known or known in the future that is suitable for use on a silicon substrate. A spiral structure 106 is formed on metal layer M1. As is well known in the art, it is conventional to include a ground plane layer, such as ground plane 302, in an integrated circuit.

The spiral structure shown in FIGS. 3 and 4 is a circular spiral, but it should be understood that the invention is not limited in this regard. The spiral structure 106 can also be a polygonal spiral, where the polygonal spiral can be in the shape of a triangle, square, rectangle, octagon, or hexagon. Those skilled in the art will appreciate that a coil of a triangle polygonal spiral will have three sides, a coil of a square polygonal spiral will have four sides, and so on. Of course other polygonal spirals are also possible, and the invention is not intended to be listed to those polygons listed here. Polygonal spiral coils are well known in the art and therefore will not be described here in detail. However, it can be understood that the fabrication process for such polygonal coils is similar to that of a circular spiral coil, with the exception that the shape of the coils would be different.

The spiral structure 106 is preferably constructed of a high conductivity material, such as gold. In an alternate embodiment, other high conductivity metals can be used for this purpose. One example of such an alternate metal would be copper. Still, the invention is not limited in this regard.

Figure 5:
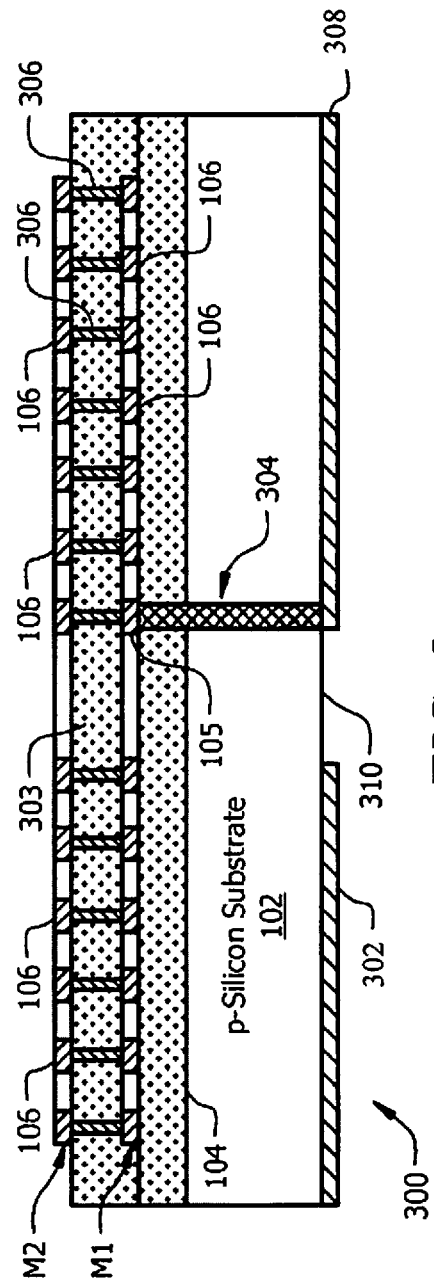
FIG. 5 is a cross-sectional view of an alternative embodiment of the invention.

In one embodiment, the spiral inductor 300 of the present can be comprised of two or more layers of spiral structures 106, formed on metal layers M1 and M2, as shown in FIG. 5. The two or more spiral layers are separated by a dielectric layer 303, and shunted together along their length by means of a plurality of conductive vias 306. Consequently, in such embodiments two or more layers are used for the turns of the spiral inductor, and these two layers provide two inductors connected in parallel to reduce ohmic losses.

In the embodiments of the invention shown in FIGS. 3-5, a conventional crossover arrangement is avoided to provide an inductor with improved Q and self resonance frequency. The arrangement in FIGS. 3-5 eliminates a conventional crossover by providing a metal filled conductive via 304 which extends from the center terminal 105 on metal layer M1 and/or M2, through the insulating layer 104 and substrate 102, to a conductive metal ground plane layer 302. As best understood from FIG. 3, the terminal end 105 is the end of the spiral structure that is enclosed by one or more coils of the spiral structure 106.

According to an embodiment of the invention, the ground plane layer 302 is a defected ground plane in which a signal trace 308 has been formed in order to provide an electrical signal path to the terminal end 105 of the spiral structure 106. The signal trace 308 is isolated from the remainder of the conductive ground plane layer 302 by a gap 310 formed in the conductive metal forming ground plane 302. This arrangement forms a coplanar wave guide in which the ground plane layer is actually part of the waveguide structure. As will be appreciated by those skilled in the art, the conductive metal ground plane is preferably constructed of a high conductivity material, such as gold. In an alternate embodiment, other high conductivity metals can be used for this purpose. One example of such an alternate metal would be copper. Still, the invention is not limited in this regard.

The invention also includes an integrated circuit comprising the inductor coil 300 as described herein. It will be appreciated by those skilled in the art that the spiral inductor 300 can be coupled to other electronic devices in an integrated circuit disposed on the substrate 102. For example the spiral structure 106 can be electrically connected to such other electronic devices by means of signal traces 308 and 305. Ground plane 302 is normally present. It becomes part of the coplanar waveguide that the signal travels through under the part. Still, the invention is not limited in this regard.

With the arrangement shown in FIGS. 3-5, the signal trace 308 leading to the center contact 105 has a reduced detrimental effect on Q as compared to a conventional underpass crossover arrangement as described with respect to FIGS. 1 and 2. Similarly, the signal trace 308 will have a reduced detrimental effect on Q as compared to conventional airbridge over/underpass arrangements. Accordingly, the value of Q and self resonance frequency achievable with the arrangement shown in FIGS. 3-5 is substantially greater as compared to these prior art configurations. The improvement in Q and self resonance is primarily due to the increase in spacing between the spiral structure 106 and the signal trace 308 in FIGS. 3-5, as compared to the spacing between spiral structure 106 and crossover 108 in FIGS. 1-2. Those skilled in the art will appreciate that an oxide layer 104, 107 typically has a thickness which ranges between 1 to 10 microns, whereas the thickness of the substrate 102 is generally 100 microns or more. Accordingly, using a signal trace 308 in defected ground plane 302 to provide a crossover for the spiral inductor can provide significantly improved performance as compared to conventional spiral inductors on a semiconductor substrate.

Conductive via 304 can be formed using any suitable technique now known, or known in the future. According to one embodiment, the via 304 can be formed by drilling a precision microhole in the silicon substrate. The microhole can be formed by utilizing a laser drilling technique. The type of laser selected for forming the microhole will depend on the size of the microhole to be formed, the microhole diameter tolerance, and material which forms the semiconductor substrate 102. Suitable laser sources can range from deep UV excimer to Nd:YAG lasers. According to one embodiment, the laser source can be an Nd:YAG laser where a base wavelength is converted to a second, third or higher harmonic to produce wavelengths in the range of 200 nanometers to 1000 nanometers. Sill the invention is not limited in this regard. Microhole drilling using laser techniques is known in the art and therefore will not be described here in detail. As an alternative to use of a laser for microhole drilling, such microholes can also be formed by using a Deep Reactive Ion Etcher (DRIE). Once the microhole has been formed in the substrate 102, it can be backfilled with a suitable conductive material such as gold. As will be appreciated by those skilled in the art, any suitable method can be used for this purpose.

The defected ground plane can be formed by any suitable method. For example, in some embodiments, the ground plane 302 can be laser ablated to form the gap 310. Alternatively, the gap 310 can be formed in the ground plane 302 by micro machining using a reactive ion etcher (RIE). Still, other embodiments are also possible as would be appreciated by one skilled in the art and all such methods now known and known in the future can be used without limitation.

Figure 6:
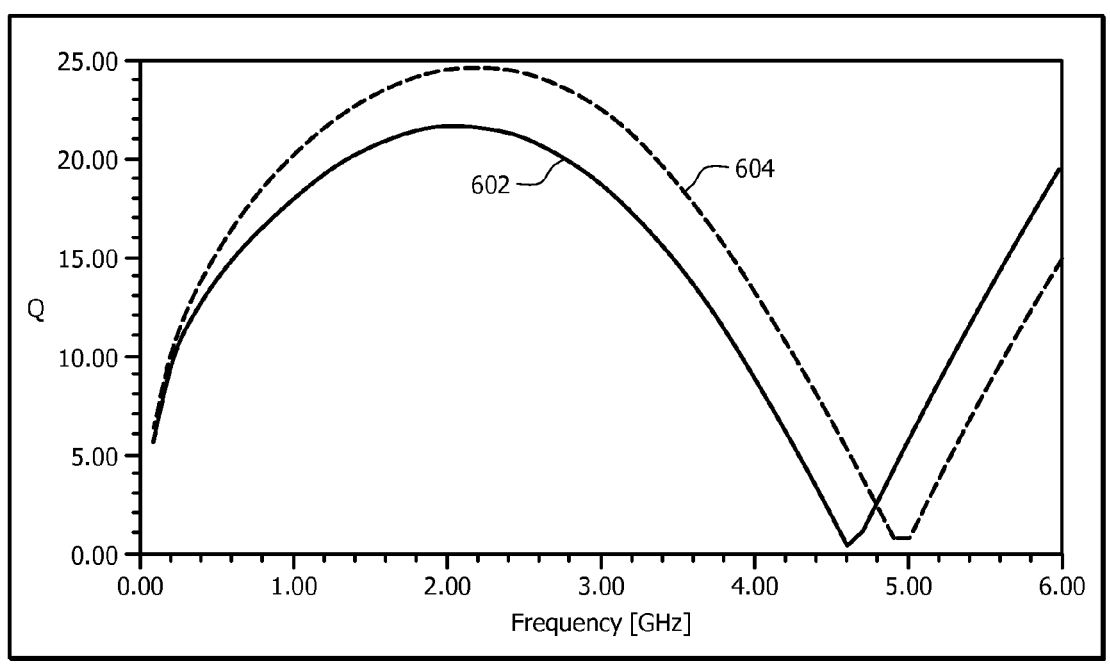
FIG. 6 is a plot which is useful for comparing a Q of a spiral inductor in accordance with the inventive arrangements, with an equivalent spiral inductor formed using conventional means.

Referring now to FIG. 6 there is provided a computer generated plot which compares the Q of spiral inductors made using conventional underpass technology, with the Q of spiral inductors made in accordance with defected ground underpass, in accordance with the present invention. The spiral inductor modeled in each case is a single circular spiral layer design on silicon, and having a 9 nanoHenry inductance value. The only difference between the two modeled coils is the arrangement of the crossovers. Plot 604 is a computer simulation for a spiral coil modeled in accordance with the arrangements shown in FIGS. 3 and 4, whereas plot 602 is a spiral coil modeled in accordance with the arrangements shown in FIGS. 1 and 2. It can be observed from curve 604 that the defected ground underpass of the invention provides a Q of about 24.6; in contrast it can be observed from curve 602 that a conventional underpass arrangement provides a Q of 21.6. Computer simulations show the self resonant frequency improved significantly from about 4.6 GHz to about 5.0 GHz.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

We claim:
1. An inductor, comprising:
a semiconductor substrate;
at least one insulating layer disposed on a first surface of said semiconductor substrate;
a first spiral structure formed of a first conductive material layer disposed on said insulating layer, said first spiral structure having a terminal end at a location enclosed by one or more coils of said first spiral structure;
a ground plane formed of a second conductive material and disposed on a second surface located on a side of said substrate opposed from said first surface, said ground plane defected so as to define a signal trace formed from a portion of said ground plane extending along an area of the second surface opposed from said spiral structure, said signal trace electrically isolated from a remainder of said ground plane by a gap in said second conductive material provided along a length of said signal trace between the signal trace and the portion of the ground plane, whereby said signal trace and said portion of said ground plane together define a coplanar waveguide; and
a conductive via extending through said at least one insulating layer, and through said semiconductor substrate, to form an electrical connection directly between said signal trace and said terminal end, said conductive via vertically aligned with said terminal end.

2. The inductor according to claim 1, wherein said semiconductor substrate is selected from the group consisting of silicon and gallium arsenide.

3. The inductor according to claim 1, wherein said insulating layer is silicon dioxide.

4. The inductor according to claim 1, wherein said first spiral structure is a circular spiral.

5. The inductor according to claim 1, wherein said first spiral structure is a polygonal spiral comprised of three or more sides.

6. The inductor according to claim 1, further comprising:
at least a second spiral structure substantially identical to and aligned with said first spiral structure; and
a plurality of conductive vias which electrically connect the first and said at least a second spiral structure periodically along a length of each, whereby at least said first and second spiral structures are connected in parallel for reduced ohmic losses.

7. A semiconductor integrated circuit comprising:
a semiconductor substrate;
at least one insulating layer disposed on a first surface of said semiconductor substrate;
a first spiral structure formed of a first conductive material layer disposed on said insulating layer, said first spiral structure having a terminal end at a location enclosed by one or more coils of said first spiral structure;
a ground plane formed of a second conductive material and disposed on a second surface located on a side of said substrate opposed from said first surface, said ground plane defected so as to define a signal trace formed from a portion of said ground plane extending along an area of the second surface opposed from said spiral structure, said signal trace electrically isolated from a remainder of said ground plane by a gap in said second conductive material provided along a length of said signal trace between the signal trace and the portion of the ground plane, whereby said signal trace and said portion of said ground plane together define a coplanar waveguide;
a conductive via extending through said at least one insulating layer, and through said semiconductor substrate, to form an electrical connection directly between said signal trace and said terminal end, said conductive via vertically aligned with said terminal end; and
a plurality of electrical components disposed on said semiconductor substrate, wherein at least one of said electrical components is electrically connected to said signal trace.

* * * * *